US012782831B2

(12) United States Patent
De Munshi et al.

(10) Patent No.: US 12,782,831 B2
(45) Date of Patent: Nov. 3, 2026

(54) OPTICAL APPARATUS

(71) Applicant: ASML Netherlands B.V., Veldhoven (NL)

(72) Inventors: Debashis De Munshi, Veldhoven (NL); Joeri De Bruijckere, Eindhoven (NL)

(73) Assignee: ASML Netherlands B.V., Veldhoven. (NL)

(*) Notice: Subject to any disclaimer, the term of this patent is extended or adjusted under 35 U.S.C. 154(b) by 58 days.

(21) Appl. No.: 18/727,975

(22) PCT Filed: Dec. 12, 2022

(86) PCT No.: PCT/EP2022/085440
§ 371 (c)(1),
(2) Date: Jul. 10, 2024

(87) PCT Pub. No.: WO2023/134937
PCT Pub. Date: Jul. 20, 2023

(65) Prior Publication Data

US 2025/0116943 A1 Apr. 10, 2025

(30) Foreign Application Priority Data

Jan. 11, 2022 (EP) .................................... 22150988

(51) Int. Cl.
*G03F 7/20* (2006.01)
*G03F 7/00* (2006.01)

(52) U.S. Cl.
CPC ........ *G03F 7/70716* (2013.01); *G03F 7/7085* (2013.01); *G03F 7/70866* (2013.01); *G03F 7/70916* (2013.01)

(58) Field of Classification Search
CPC ............... G03F 7/70716; G03F 7/7085; G03F 7/70866; G03F 7/70916
See application file for complete search history.

(56) References Cited

U.S. PATENT DOCUMENTS 6,972,576 B1 12/2005 Lyons et al.
2005/0225308 A1 10/2005 Orvek
(Continued)

FOREIGN PATENT DOCUMENTS

CN 107063470 A 8/2017
DE 102016206210 A1 10/2017
(Continued)

OTHER PUBLICATIONS

International Search Report and Written Opinion of the International Searching Authority directed to International Patent Application No. PCT/EP2022/085440, mailed Mar. 24, 2023; 9 pages.
(Continued)

*Primary Examiner* — Mesfin T Asfaw
(74) *Attorney, Agent, or Firm* — Finnegan, Henderson, Farabow, Garrett & Dunner LLP

(57) ABSTRACT

An optical apparatus for a reticle stage of a lithographic apparatus is disclosed. The optical apparatus comprises: a reflective optical element comprising a surface for exposure to radiation; at least two electrodes located at the surface; and a measurement system configured to measure one or more electrical characteristics of the reflective optical element between the at least two electrodes. Also disclosed is a method of measuring a degradation of a reflective optical element having a surface for exposure to radiation in a lithographic apparatus, the method comprising: providing at least two electrodes at the surface of the reflective optical element; and measuring one or more electrical characteristics of the reflective optical element between the at least two electrodes.

15 Claims, 9 Drawing Sheets

(56) References Cited

U.S. PATENT DOCUMENTS

| | | | | |
|---|---|---|---|---|
| 2014/0285783 | A1* | 9/2014 | Dinger | G02B 5/0891 359/359 |
| 2018/0164581 | A1* | 6/2018 | Hakvoort | G03F 7/70191 |
| 2021/0208500 | A1 | 7/2021 | Vles et al. | |

FOREIGN PATENT DOCUMENTS

| | | | |
|---|---|---|---|
| JP | H11-329931 | A | 11/1999 |
| JP | 2006-245255 | A | 9/2006 |
| TW | 201316841 | A | 4/2013 |

OTHER PUBLICATIONS

International Preliminary Report on Patentability directed to International Patent Application No. PCT/EP2022/085440, issued Jun. 20, 2024; 6 pages.

Bahrami et al., "Capacitance-based damage detection sensing for aerospace structural composites," Proc. SPIE, vol. 9061, Sensors and Smart Structures Technologies for Civil, Mechanical, and Aerospace Systems, Apr. 10, 2024; 9 pages.

Wen et al., "Damage detection of carbon fiber reinforced polymer composites via electrical resistance measurement," Composites Part B: Engineering, vol. 42, No. 1, Jan. 2011; pp. 77-86.

Research Disclosure No. 587008, Feb. 1, 2013; 7 pages.

Research Disclosure No. 600053, Mar. 18, 2014; 4 pages.

* cited by examiner

OPTICAL APPARATUS

CROSS-REFERENCE TO RELATED APPLICATIONS

This application claims priority of EP application 22150988.8 which was filed on 11 Jan. 2022, and which is incorporated herein in its entirety by reference.

FIELD

The present invention relates to an optical apparatus and to a method for measuring a degradation of a reflective optical element having a surface for exposure to radiation in a lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

In use, operation of the patterning device may become degraded over time due to, for example, an accumulation of debris deposited on a surface of the patterning device.

In some examples an optical element, generally known in the art as a 'fiducial', may be disposed in relatively close proximity to the patterning device. Like the patterning device, operation of the fiducial may also become degraded over time.

The optical element may be used to reflect radiation towards a sensor. A further optical element may also be used to reflect radiation towards a/the sensor, thereby providing a reference. As such, a degree of degradation of the operation of the optical element relative to the further optical element may be determined. This may be indicative of the degradation of the operation of the patterning device.

In response to the determined degradation, a dosage and/or a profile of the electromagnetic radiation projected towards the patterning device may be corrected.

However, in use operation of the further optical element, e.g. the reference, may also be degraded to at least some extent. That is, the reference may not operate as a constant reference, leading to drift in measurements of degradation of the operation of the optical element relative to the further optical element.

It is therefore desirable to provide a reliable means to determine any degradation in the operation of the patterning device, such that the dosage and/or the profile of the electromagnetic radiation projected towards the patterning device may be corrected accordingly.

It is therefore an aim of at least one embodiment of at least one aspect of the present disclosure to obviate or at least mitigate at least one of the above identified shortcomings of the prior art.

SUMMARY

According to a first embodiment of the disclosure, there is provided an optical apparatus for a reticle stage of a lithographic apparatus, the optical apparatus comprising: a reflective optical element comprising a surface for exposure to radiation; at least two electrodes located at the surface; and a measurement system configured to measure one or more electrical characteristics of the reflective optical element between the at least two electrodes.

Advantageously, by measuring electrical characteristics rather than optical characteristics of the optical element, a direct measurement that may be indicative of degradation in reflectivity of the reflective optical element can be made without need to rely on a further optical reference.

Furthermore, by mitigating the need to rely on a further optical reference, a down-time of the lithographic apparatus may be minimised, because replacement of the further optical reference is not necessary.

Advantageously, by having the electrodes located at the surface, any effects of carbon growth at the surface may be detected by detection of changes in the electrical characteristics of the optical element between the electrodes, e.g. by a decrease in a resistance due to a conductive path formed by the layer of carbon.

The one or more electrical characteristics may comprise at least one of: a capacitance; a resistance; an inductance; and/or a frequency response.

The reflective optical element may comprise a plurality of layers. The at least two electrodes may extend through the plurality of layers.

Advantageously, by having the electrode extending through the plurality of layers, the effects of oxidation at or between any of the layers may be detected by detection of changes in the electrical characteristics of the optical element between the electrodes. Similarly, by having the electrodes extending through the plurality of layers, any effects of thermal interdiffusion between the layers may be detected by detection of changes in the electrical characteristics of the optical element between the electrodes.

The reflective optical element may be configured as a distributed Bragg reflector for reflecting extreme ultraviolet, EUV, radiation.

The optical apparatus may comprise at least one electrode formed on each layer of the reflective optical element. The measurement system may be configured to measure one or more electrical characteristics of each layer of the reflective optical element.

The measurement system may be configured to perform a plurality of measurements taken at different times of the one or more electrical characteristics of the reflective optical element to identify a degradation in reflectivity of the reflective optical element.

The optical apparatus may comprise greater than two electrodes. The measurement system may be configured to measure the one or more electrical characteristics of the reflective optical element between pairs of electrodes of the plurality of electrodes.

Advantageously, a profile of the electrical characteristics of the reflective optical element may be determined, wherein the profile may of the electrical characteristics may correspond to a reflectivity profile of the reflective optical element.

The measurement system may be configured to determine a reflectivity profile of the reflective optical element based, at least in part, on measurements of the one or more electrical characteristics between the greater than two electrodes.

The greater than two electrodes may be distributed around a periphery of the surface.

The optical apparatus may comprise a plurality of measurement systems. Each electrode may be connected to a respective measurement system of the plurality of measurement systems.

The measurement system may be configured to determine a reflectivity profile of the reflective optical element based, at least in part, on measurements of the one or more electrical characteristics between the greater than two electrodes.

According to a second aspect of the disclosure, there is provided a lithographic apparatus comprising the optical apparatus according to the first aspect.

The lithographic apparatus may comprise the reticle stage for holding a reticle. The reflective optical element may be mounted on, or embedded in, the reticle stage and configured to reflect the radiation towards a radiation sensor.

According to a third aspect of the disclosure, there is provided a lithographic system comprising an EUV radiation source and a lithographic apparatus according to the second aspect.

The lithographic system may comprise a further system communicably coupled to the measurement system. The further system may be configured to adjust an intensity and/or a profile of a beam of radiation for exposing a substrate based, at least in part, on the measured one or more electrical characteristics of the reflective optical element.

According to a fourth aspect of the disclosure, there is provided a method of measuring a degradation of a reflective optical element having a surface for exposure to radiation in a lithographic apparatus, the method comprising: providing at least two electrodes at the surface of the reflective optical element; and measuring one or more electrical characteristics of the reflective optical element between the at least two electrodes.

Greater than two electrodes may be provided at the surface of the reflective optical element. A reflectivity profile of the reflective optical element may be determined based, at least in part, on measurements of the one or more electrical characteristics between the greater than two electrodes.

A degradation of the reflective optical element may be identified by comparing a plurality of measurements of the one or more electrical characteristics taken at different times.

The step of measuring one or more electrical characteristics of the reflective optical element between the at least two electrodes may be performed during a run time of the lithographic apparatus.

The above summary is intended to be merely exemplary and non-limiting. The disclosure includes one or more corresponding aspects, embodiments or features in isolation or in various combinations whether or not specifically stated (including claimed) in that combination or in isolation. It should be understood that features defined above in accordance with any aspect of the present disclosure or below relating to any specific embodiment of the disclosure may be utilized, either alone or in combination with any other defined feature, in any other aspect or embodiment or to form a further aspect or embodiment of the disclosure.

BRIEF DESCRIPTION OF THE DRAWINGS

Embodiments of the invention will now be described, by way of example only, with reference to the accompanying schematic drawings, in which.

DETAILED DESCRIPTION

Figure 1:
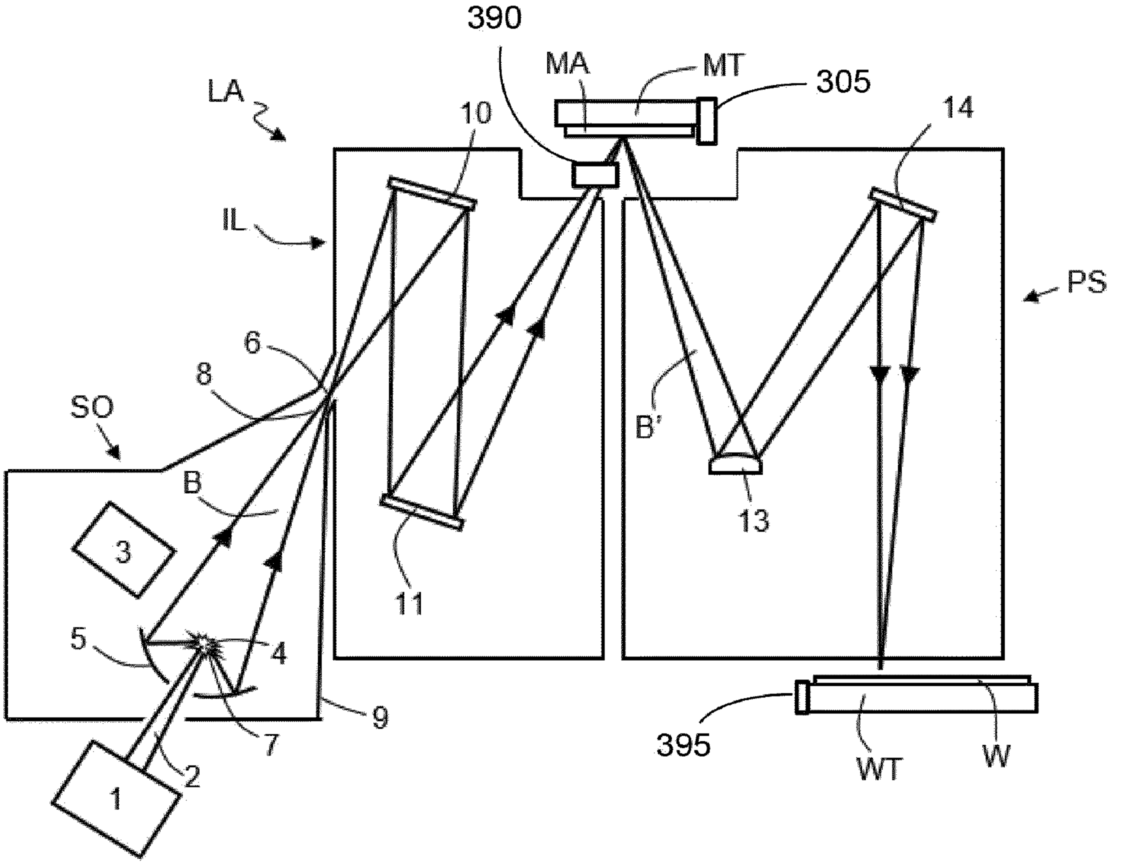
FIG. 1 depicts a lithographic system comprising a lithographic apparatus and a radiation source.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS and a substrate table WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13,14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13,14 in FIG. 1, the projection system PS may include a different number of mirrors (e.g., six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO shown in FIG. 1 is, for example, of a type which may be referred to as a laser produced plasma (LPP) source. A laser system 1, which may, for example, include a CO2 laser, is arranged to deposit energy via a laser beam 2 into a fuel, such as tin (Sn) which is provided from, e.g., a fuel emitter 3. Although tin is referred to in the following description, any suitable fuel may be used. The fuel may, for example, be in liquid form, and may, for example, be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a tin plasma 7 at the plasma formation region 4. Radiation, including EUV radiation, is emitted from the plasma 7 during de-excitation and recombination of electrons with ions of the plasma.

The EUV radiation from the plasma is collected and focused by a collector 5. Collector 5 comprises, for example, a near-normal incidence radiation collector 5 (sometimes referred to more generally as a normal-incidence radiation collector). The collector 5 may have a multilayer mirror structure which is arranged to reflect EUV radiation (e.g., EUV radiation having a desired wavelength such as 13.5 nm). The collector 5 may have an ellipsoidal configuration, having two focal points. A first one of the focal points may be at the plasma formation region 4, and a second one of the focal points may be at an intermediate focus 6, as discussed below.

The laser system 1 may be spatially separated from the radiation source SO. Where this is the case, the laser beam 2 may be passed from the laser system 1 to the radiation source SO with the aid of a beam delivery system (not shown) comprising, for example, suitable directing mirrors and/or a beam expander, and/or other optics. The laser system 1, the radiation source SO and the beam delivery system may together be considered to be a radiation system.

Radiation that is reflected by the collector 5 forms the EUV radiation beam B. The EUV radiation beam B is focused at intermediate focus 6 to form an image at the intermediate focus 6 of the plasma present at the plasma formation region 4. The image at the intermediate focus 6 acts as a virtual radiation source for the illumination system IL. The radiation source SO is arranged such that the intermediate focus 6 is located at or near to an opening 8 in an enclosing structure 9 of the radiation source SO.

Although FIG. 1 depicts the radiation source SO as a laser produced plasma (LPP) source, any suitable source such as a discharge produced plasma (DPP) source or a free electron laser (FEL) may be used to generate EUV radiation.

As described above, an optical element generally known in the art as a 'fiducial', may be disposed in relatively close proximity to the patterning device MA. In some examples, such an optical element may be mounted on or embedded in the support structure MT.

Figure 2:
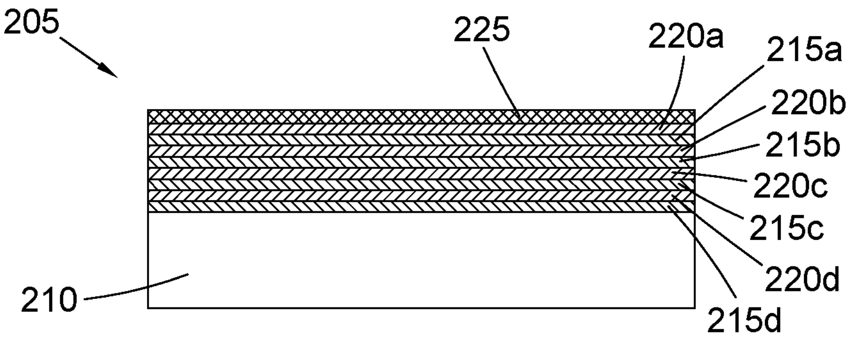
FIG. 2 (PRIOR ART)
FIG. 2 depicts a cross-section of a prior art optical element.

The optical element may be used to reflect radiation towards a sensor 395, for determining a degree of degradation in reflectivity of the optical element relative to a reference. FIG. 2 depicts a cross-section of such an optical element.

The optical element 205 of FIG. 2 is formed as a distributed Bragg reflector suitable for reflecting EUV radiation. That is, the optical element 205 comprises a substrate 210 upon which stack comprising a plurality of layers of alternating or varying refractive index materials are formed. The example optical element 205 comprises a plurality of alternate layers of Silicon 215*a-d* and layers of Molybdenum 220*a-d*.

Also depicted is a capping layer 225 which, for purposes of example, is formed from Ruthenium. The capping layer 225 may protect the underlying layers of Silicon 215*a-d* and layers of Molybdenum 220*a-d* against active Oxygen and Hydroxyl radicals.

As described above, in a prior art lithographic apparatus, a degradation in reflectivity of the optical element 205 may be determined relative to a reference optical element, wherein the determined degradation may be indicative of a degradation in reflectivity of the patterning device MA. However, the reference optical element (which may have generally the same layered structure as the optical element 205) may also be subject to degradation, and therefore may not provide a stable reference.

Figure 3:
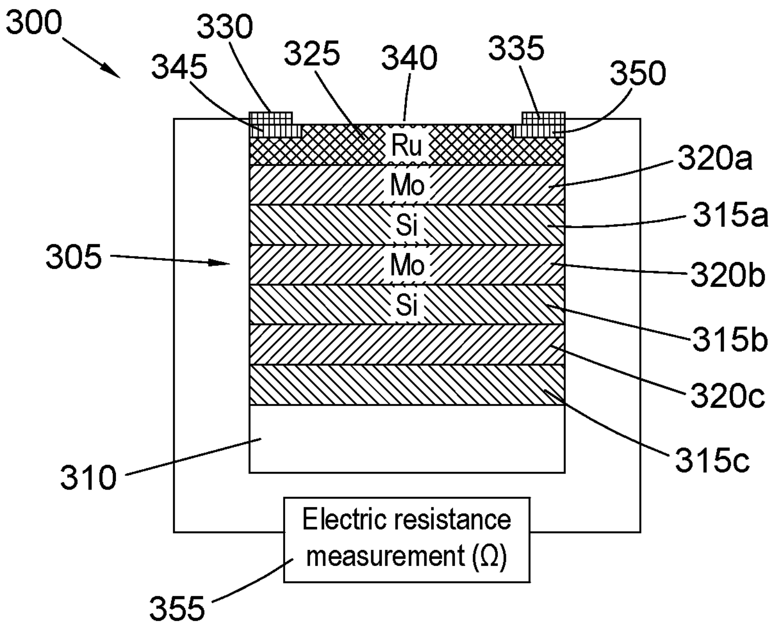
FIG. 3 depicts a cross-section of an optical apparatus for a reticle stage of a lithographic apparatus, according to an embodiment of the disclosure.

Turning now to FIG. 3, there is depicted a cross-section of an optical apparatus 300 for a reticle stage, e.g. support structure MT, of a lithographic apparatus LA, according to an embodiment of the disclosure.

The optical apparatus 300 comprises a reflective optical element 305 comprising a surface 340 for exposure to radiation. Similar to the example optical element 205, the reflective optical element 305 is formed as a distributed Bragg reflector suitable for reflecting EUV radiation. For purposes of example, the reflective optical element 305 comprises a substrate 310 and a plurality of alternate layers of Silicon 315*a-d* and layers of Molybdenum 320*a-d*, with a capping layer 325 of Ruthenium. In other embodiments of the disclosure, other materials may be implemented.

The reflective optical element 305 may be mounted on or embedded in the reticle stage, e.g. support structure MT, of the lithographic apparatus. The reflective optical element 305 may be configured to reflect the radiation towards a radiation sensor 395. Such a radiation sensor 395 may, for example, be disposed at or near a substrate to be patterned, such as on the substrate table WT.

A first electrode 330 and a second electrode 335 are located at the surface 340. Although only two electrodes 330, 335 are depicted, in other embodiments more than two electrodes may be implemented, as will be described in more detail below with reference to the examples of FIGS. 5, 8 and 10.

The first electrode 330 is electrically isolated from the capping layer 325 by a first portion of insulating material 345. The second electrode 335 is electrically isolated from the capping layer 325 by a second portion of insulating material 350. The first portion of insulating material 345 and the second portion of insulating material 350 may be formed from a single layer of insulating material.

Also depicted is a measurement system 355. The measurement system 355 is configured to measure one or more electrical characteristics of the reflective optical element 305 between the first electrode 330 and the second electrode 335. That is, the measurement system 355 is conductively coupled to the first electrode 330 and the second electrode 335.

For example, the measurement system 355 may be configured to measure any or all of a capacitance, a resistance, or an inductance of the reflective optical element 305 between the first electrode 330 and the second electrode 335. In some examples, the measurement system 355 may be configured to measure a frequency response and/or an impulse response of the reflective optical element 305 between the first electrode 330 and the second electrode 335.

In some embodiments, the measurement system 355 may be located relatively close to the optical element 305, for example at or near the reticle stage. In other embodiments, the measurement system 355 may be remote from the optical element 305. In yet further embodiments, some or all of the measurement system 355 may comprise a distributed device or a networked device.

Operation of the optical apparatus 300 is now described with reference to FIG. 4, which depicts a series of cross-sections of the optical apparatus 300 of FIG. 3, showing an accumulation of carbon on the surface 340 over a period of time.

Figure 4:
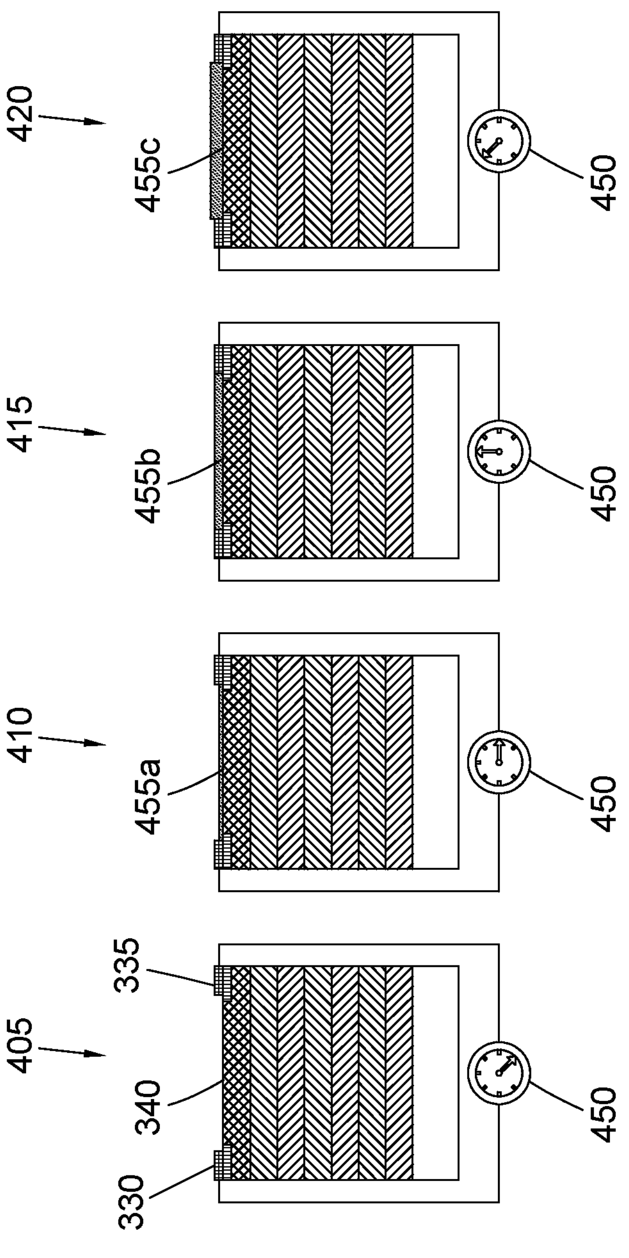
FIG. 4 depicts a series of cross-sections of the optical apparatus of FIG. 3, showing an accumulation of carbon on a surface.

In the example of FIG. 4, the measurement system 355 is configured to determine a resistance between the first electrode 330 and the second electrode 335. At a first time 405, e.g. shortly after initial installation of the optical element 305 on a reticle stage of a lithographic apparatus, there is no (or negligible amount of) carbon deposited on the surface 340 of the optical element. As such, no conductive path exists between the first electrode 330 and the second electrode 335. Thus, the measurement system 355 detects a high resistance, e.g. no or negligible current flow, between the first electrode 330 and the second electrode 335, as indicated by the ohmmeter display 450.

At a second time 410, e.g. after the first time 405, a thin layer of carbon 455 has accumulated on the surface 340 of the optical element 305.

That is, in an example of a use of an EUV lithographic apparatus LA, some vaporised hydrocarbons may be present which may form a layer of hydrocarbons upon the surface 340 of the optical element 305. Irradiation of the layer of hydrocarbons by EUV radiation may effectively carbonise the layer, burning off any oxygen atoms and leaving a layer of carbon 'soot' on the surface 340 of the optical element 305. This carbon soot, e.g. layer of carbon 455*a*, may reduce a reflectively of the optical element 305.

Although a layer of carbon is described in the above example, it will be appreciated that other elements and chemicals may additionally or alternatively form such a layer over the surface 340 of the optical element 305.

It will be understood that references to the measurement system being configured to measure one or more electrical characteristics of the reflective optical element 305 between the first electrode 330 and the second electrode 335 also refers to any layers that may be formed on the reflective optical element 305, e.g. the above-described layer of carbon 455.

At the second time 410, a thin layer of carbon 455*a* forms a conductive path between the first electrode 330 and the second electrode 335. As such, the measurement system 355 detects a lower resistance at the second time 410 than at the first time 405, as indicated by the ohmmeter display 450.

At a third time 415, e.g. after the second time 410, a thicker layer of carbon 455*b* has accumulated on the surface 340 of the optical element 305. As such, the measurement system 355 detects an even lower resistance at the third time 415 than at the second time 410, as indicated by the ohmmeter display 450.

At a fourth time 420, e.g. after the third time 415, an even thicker layer of carbon 455*c* has accumulated on the surface 340 of the optical element 305. As such, the measurement system 355 detects an even lower resistance at the fourth time 420 than at the third time 415, as indicated by the ohmmeter display 450. Although not depicted in FIG. 4, the layer of carbon 455*a*, 455*b*, 455*c* may also form over the first electrode 330 and the second electrode 335.

The resistance between the first electrode 330 and the second electrode 335 may be indicative of a reflectively of the optical element 305. For example, a calibration phase, which may occur offline and/or using a separate optical element 305, may be performed to associate a particular level of resistance with a particular thickness of the layer of carbon 455*a*, 455*b*, 455*c*, and hence a particular reflectively of the optical element 305.

That is, in embodiments of the disclosure, the measurement system 355 is configured to perform a plurality of measurements taken at different times, e.g. the first, second, third and fourth times 405, 410, 415, 420, of the one or more electrical characteristics of the reflective optical element 305 to identify a degradation over time in reflectivity of the reflective optical element 305.

Figure 5:
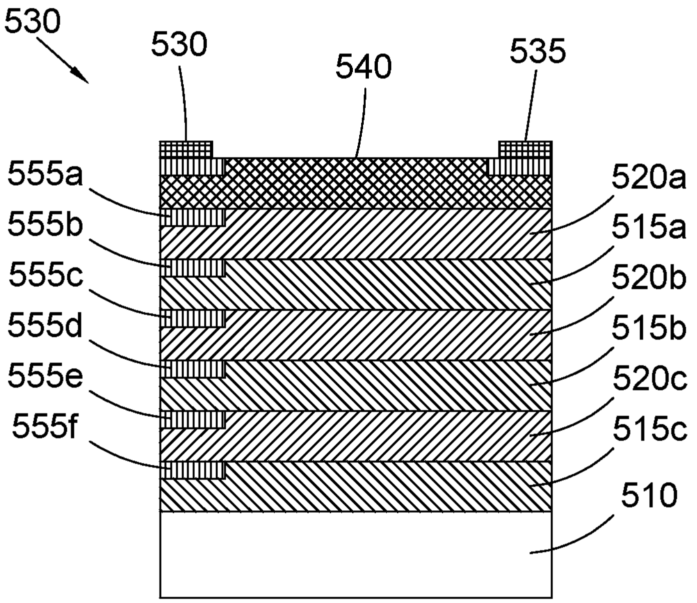
FIG. 5 depicts a cross-section of an optical element for use in an optical apparatus for a reticle stage of a lithographic apparatus, according to a further embodiment of the disclosure.

FIG. 5 depicts a cross-section of an optical element 505 for use in an optical apparatus for a reticle stage of a lithographic apparatus LA, according to a further embodiment of the disclosure. The example optical element 505 of FIG. 5 comprises generally the same features as the optical element 305 of FIG. 3, e.g. a substrate 510, a plurality of alternate layers of Silicon 515*a-d* and layers of Molybdenum 520*a-d*, with a capping layer 525 and a first electrode 530 and a second electrode 535 located at the surface 540.

In the example optical element 505 of FIG. 5, an electrode 555*a-f* is formed on each layer of the plurality of alternate layers of Silicon 515*a-d* and layers of Molybdenum 520*a-d*.

The electrodes 555*a-f* may be formed by a deposition process, by a lithographic process, by printing, or by other known means.

In use, a measurement system, e.g. the measurement system 355 of the example of FIG. 3, may be configured to measure one or more electrical characteristics of each alternate layers of Silicon 515*a-d* and layers of Molybdenum 520*a-d* of the optical element 505. That is, such a measurement system may be configured to determine any or all of a capacitance, a resistance, or an inductance of the reflective optical element 505 between the first electrode 530 and the second electrode 535 and/or between any or all of the alternate layers of Silicon 515*a-d* and layers of Molybdenum 520*a-d*. In some examples, such a measurement system may be configured to measure a frequency response and/or an impulse response of the reflective optical element 505 between the first electrode 530 and the second electrode 535 and/or between any or all of the alternate layers of Silicon 515*a-d* and layers of Molybdenum 520*a-d*.

Furthermore, although only a single electrode 555*a-f* is formed on each layer in the example of FIG. 5, in other embodiments more than a single electrode may be formed on each layer. As such, in example embodiments the measurement system configured may be configured to measure one or more electrical characteristics between at least two electrodes on each layer of the optical element 505.

Figure 6:
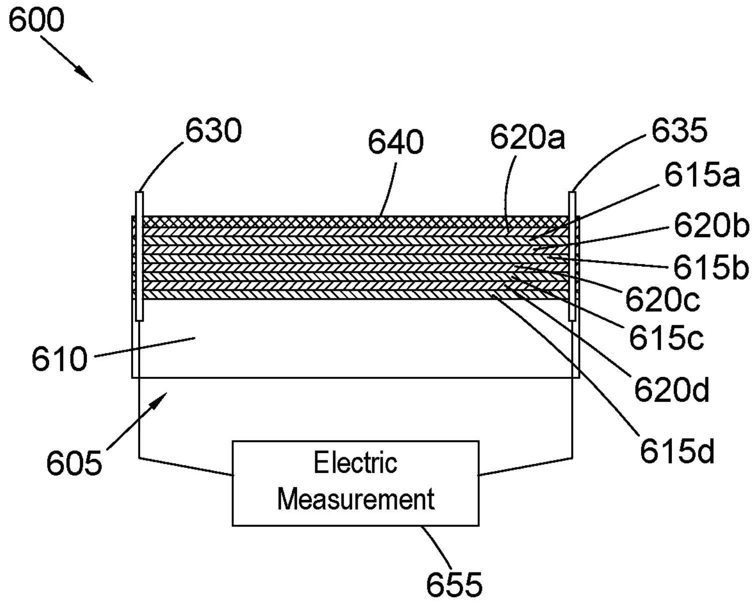
FIG. 6 depicts a cross-section of an optical apparatus for a reticle stage of a lithographic apparatus, according to a further embodiment of the disclosure.

Turning now to FIG. 6, there is depicted a cross-section of an optical apparatus 600 for a reticle stage, e.g. support structure MT, of a lithographic apparatus LA, according to an embodiment of the disclosure. The optical apparatus 600 share many of the same features as the optical apparatus 300 of FIG. 3, and therefore such features are not described in great detail for purposes of brevity. For example, the optical apparatus 600 also comprises an optical element 605 formed from a substrate 610, a plurality of alternate layers of Silicon 615*a-d* and layers of Molybdenum 620*a-d*, with a capping layer 625. A first electrode 630 and a second electrode 635 are located at the surface 640.

Also depicted is a measurement system 655. The measurement system 655 is configured to measure one or more electrical characteristics of the reflective optical element 605 between the first electrode 630 and the second electrode 635. That is, the measurement system 655 is conductively coupled to the first electrode 630 and the second electrode 635.

In contrast to the optical apparatus 300, the first electrode 630 and the second electrode 635 located at the surface 640 of the optical element 605 extend through the plurality of layers, e.g. through the plurality of alternate layers of Silicon 615*a-d* and layers of Molybdenum 620*a-d*.

In the example of FIG. 6, the first electrode 630 and the second electrode 635 are embedded within the substrate 610. In other examples, the first electrode 630 and the second electrode 635 may be formed on the substrate 610.

The first electrode 630 and the second electrode 635 may be formed by a deposition process, by a lithographic process, by printing, or by other known means. In an example method of manufacture, the first electrode 630 and the second electrode 635 are formed on the substrate 610, and the plurality of alternate layers of Silicon 615*a-d* and layers of Molybdenum 620*a-d* and the capping layer 625 are subsequently formed on the substrate 610 by known thin-film deposition processes.

Operation of the optical apparatus 600 is now described with reference to FIG. 7, which depicts a series of cross-sections of the optical apparatus 600 of FIG. 6, showing various modes of degradation of reflectivity of the optical element 605.

A first cross section 700*a* depicts the optical apparatus 600 before any degradation of reflectivity has occurred.

A second cross section 700*b* depicts the optical apparatus 600 wherein at least the capping layer 625 has undergone a degree of oxidation (depicted using graphical representations of oxygen molecules 705). In some example, e.g. in the second cross section 700*b*, upper layers of the plurality of alternate layers of Silicon 615*a-d* and layers of Molybdenum 620*a-d* may also undergo oxidation.

Such oxidation may result in an oxide coating forming over the surface 640 and/or within and/or between the plurality of alternate layers of Silicon 615*a-d* and layers of Molybdenum 620*a-d*. The formation of oxides may degrade a reflectivity of the optical element 605.

Advantageously, by having the first electrode 630 and the second electrode 635 extending through the plurality of layers, the effects of oxidation at or between any of the layers may be detected by detection of changes in the electrical characteristics of the optical element 605 between the first electrode 630 and the second electrode 635.

A third cross section 700*c* depicts the optical apparatus 600 wherein a layer of carbon 710 has formed at the surface 640, as described above with reference to FIG. 4. The layer of carbon 710 may degrade a reflectivity of the optical element 605.

Advantageously, by having the first electrode 630 and the second electrode 635 extending to the surface 640 of the plurality of layers, the effects of carbon growth at the surface may be detected by detection of changes in the electrical characteristics of the optical element 605 between the first electrode 630 and the second electrode 635, e.g. by a decrease in a resistance due to a conductive path formed by the layer of carbon 710.

A fourth cross section 700*d* depicts the optical apparatus 600 wherein thermal interdiffusion 715 between layers has occurred. That is, due to exposure to relatively high temperatures, Molybdenum and Silicon may have diffused into opposing layers of the layers of Silicon and Molybdenum respectively, potentially impacting upon an effectiveness of the optical element 605 to operate as a Bragg reflector.

Advantageously, by having the first electrode 630 and the second electrode 635 extending through the plurality of layers, the effects of thermal interdiffusion between the layers may be detected by detection of changes in the electrical characteristics of the optical element 605 between the first electrode 630 and the second electrode 635.

Although oxidation, thermal interdiffusion and carbon growth are depicted in separate cross-sections 700*b*, 700*c*, 700*d*, it will be appreciated that any combination of these effects may occur. However, it is also noted that in a practical EUV lithography apparatus, carbon growth may be a dominant contributor to a degradation in reflectively of the optical element 605, due at least in part to a layer of carbon effectively protecting the optical element from further oxidation.

Figure 7:
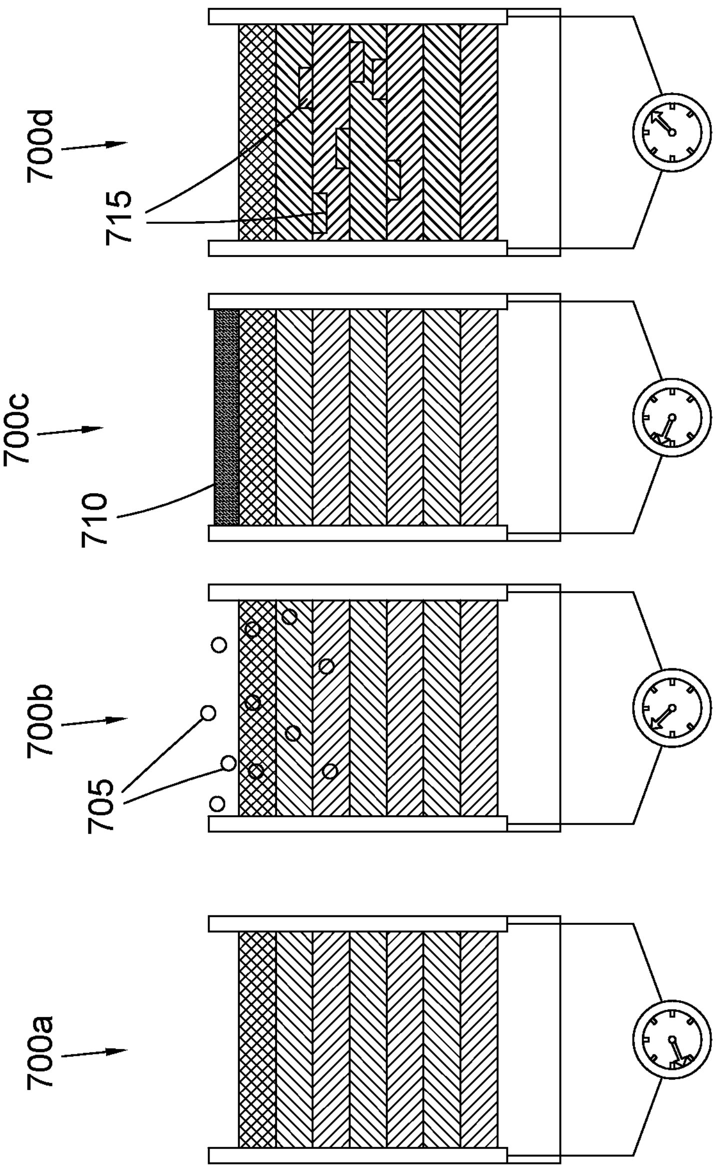
FIG. 7 depicts a series of cross-sections of the optical apparatus of FIG. 6, showing various modes of degradation of reflectivity of the optical apparatus.
Figure 8:
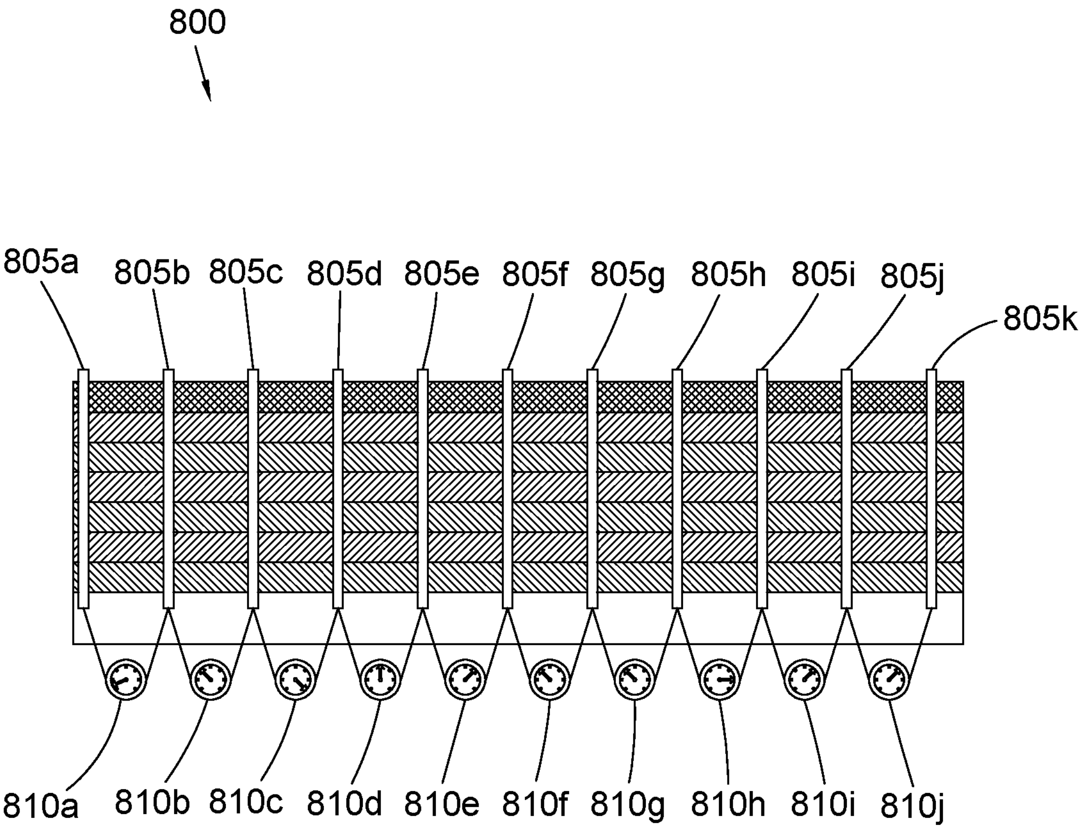
FIG. 8 depicts a cross-section of an optical apparatus for a reticle stage of a lithographic apparatus, according to a further embodiment of the disclosure.

Although the examples of FIGS. 6 and 7 depict only a first electrode 630 and a second electrode 635, in other examples more than two electrodes may be implemented. For example, FIG. 8 depicts a cross-section of an optical apparatus 800 for a reticle stage of a lithographic apparatus, according to a further embodiment of the disclosure, comprising eleven electrodes 805*a-k*. It will be understood that fewer than or greater than eleven electrode may be practically implemented.

Also depicted is a plurality of measurement systems 810*a-j*. Each electrode 805*a-k* is connected to a respective measurement system of the plurality of measurement systems 810*a-j*. In the example, a pair of electrodes are coupled to each measurement system. For example: a first electrode 805*a* and a second electrode 805*b* are coupled to a first measurement system 810*a*; the second electrode 805*b* and a third electrode 805*c* are coupled to a second measurement system 810*b*; and so on. As such, the measurement systems 810*a-j* may be configured to determine a reflectivity profile of the optical element based, at least in part, on measurements of one or more electrical characteristics between each of the electrodes 805*a-k*.

Although references are made throughout to "measurement systems", it will be understood that a plurality of such measurement systems may, in some instances, be collectively referred to as a measurement system.

Although each electrode 805*a-k* extends through multiple layers of the optical element of the optical apparatus 800, in other embodiments one or more of the electrodes may be formed at a surface of the optical element, e.g. as depicted in the embodiments of FIGS. 3 and 4.

Advantageously, the measurement systems 810*a-j* may be configured to determine a reflectivity profile of the reflective optical element based, at least in part, on measurements of the one or more electrical characteristics between the electrodes 805*a-k*, as described in more detail below with reference to FIG. 10.

Figure 9:
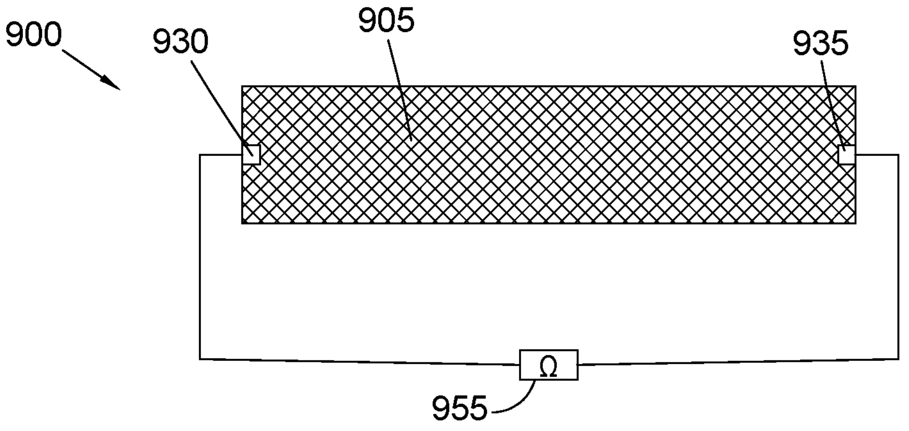
FIG. 9 depicts an optical apparatus having electrodes coupled to a measurement system, according to an embodiment of the disclosure.

FIG. 9 depicts a representation of an optical apparatus 900 having an optical element 905 is depicted in plan view. Also depicted is a first electrode 930 and a second electrode 935 coupled to a measurement system 955.

In the example of FIG. 9, the measurement system 900 may be configured to measure one or more electrical characteristics of the optical element 905 between the two electrodes 930, 935.

The electrodes 930, 935 are located around a periphery of a surface of the optical element 905. The optical element 905 has a generally elongate shape, and the electrodes 930, 935 are located at opposing ends. One or both electrodes 930, 935 may be formed on the surface of the optical element 905, e.g. as depicted in the embodiments of FIGS. 3 and 4, or may extend through the optical element 905, e.g. as depicted in the embodiments of FIGS. 6, 7 and 8.

Figure 10:
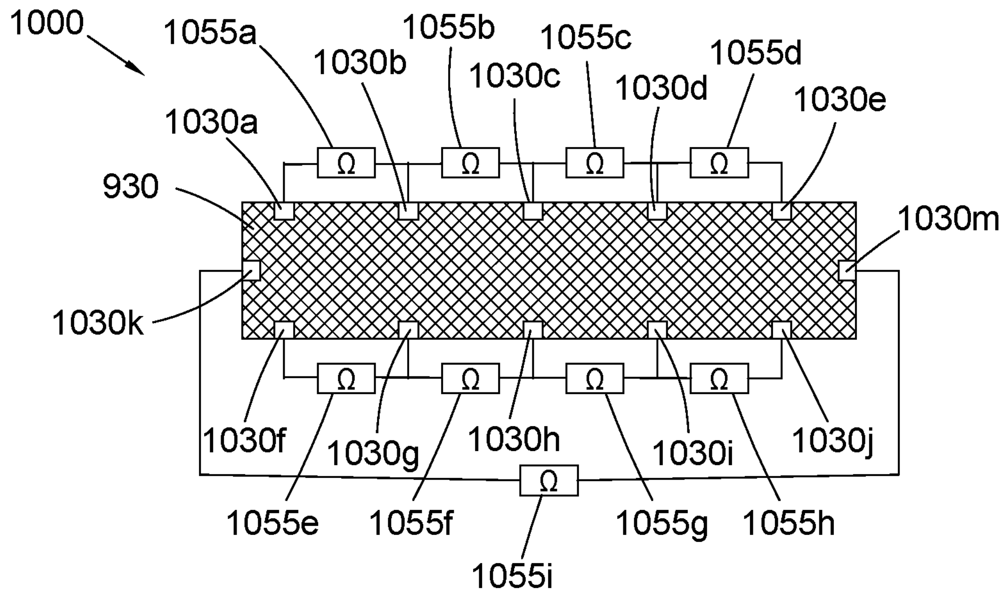
FIG. 10 depicts an optical apparatus having electrodes coupled to a measurement system, according to a further embodiment of the disclosure.

FIG. 10 depicts another representation of an optical apparatus 1000 having a plurality of electrodes 1030*a-m* distributed around a periphery of an optical element. The optical element 1005 is also depicted in plan view.

The plurality of electrodes 1030*a-m* are coupled to respective measurement systems 1055*a-i*. In the particular example, pairs of electrodes 1030*a-m* are coupled to respective measurement systems 1055*a-i*. For example: a first electrode 1030*a* and a second electrode 1030*b* are coupled to a first measurement system 1055*a*; the second electrode 1030*b* and a third electrode 1030*c* are coupled to a second measurement system 1055*b*; and so on. The measurement systems 1055*a-j* may be configured to measure one or more electrical characteristics of the optical element 1005 between the respective pairs of electrodes 1030*a-m*.

In the example, electrodes at opposite ends of the optical element, e.g. electrode 1030*k* and 1030*m*, are coupled to a measurement system 1055*i*.

The electrodes 1030*a-m* are distributed around a periphery of a surface of the optical element 1005. One or more of the electrodes 1030*a-m* may be formed on the surface of the optical element 1005, e.g. as depicted in the embodiments of FIGS. 3 and 4, or may extend through the optical element 1005, e.g. as depicted in the embodiments of FIGS. 6, 7 and 8.

Beneficially, such a distribution of electrodes enables a profile of the electrical characteristics of the optical element to be determined, wherein the profile of electrical characteristics may correspond to a reflectively profile. This may be advantageous because, for example, deposition of a layer of carbon may not be uniform across the entire surface of the optical element, and thus reflectively of the optical element may be different in different regions of the optical element.

Operation of the disclosed optical apparatus 300 is further described with reference again to the lithographic system of FIG. 1, which comprises a lithographic apparatus LA and a radiation source SO. As described above, FIG. 1 also depicts the optical element 305 of the optical apparatus 300 embedded or mounted on the reticle stage, e.g. support structure MT, and a sensor 395 at the substrate table WT. The optical element 305 may be used to reflect radiation towards the sensor 395.

In some examples, the lithographic system may comprise a further system 390. The further system 390 may be a uniformity correction module, known in the art as a 'Unicom', configurable to correct or reduce non-uniformities, e.g., intensity non-uniformities, that may be present in the EUV radiation beam B or the patterned EUV radiation beam B'.

In some examples, the further system 390 may be communicably coupled to the measurement system 355, 655, 810*a-j*, 955, 1055*a-i* of the optical apparatus 300, 600, 800, 900, 1000. The further system 390 may be configured to adjust an intensity and/or a profile of the EUV radiation beam B or the patterned EUV radiation beam B' based, at least in part, on the measured one or more electrical characteristics of the reflective optical element 305.

Figure 11:
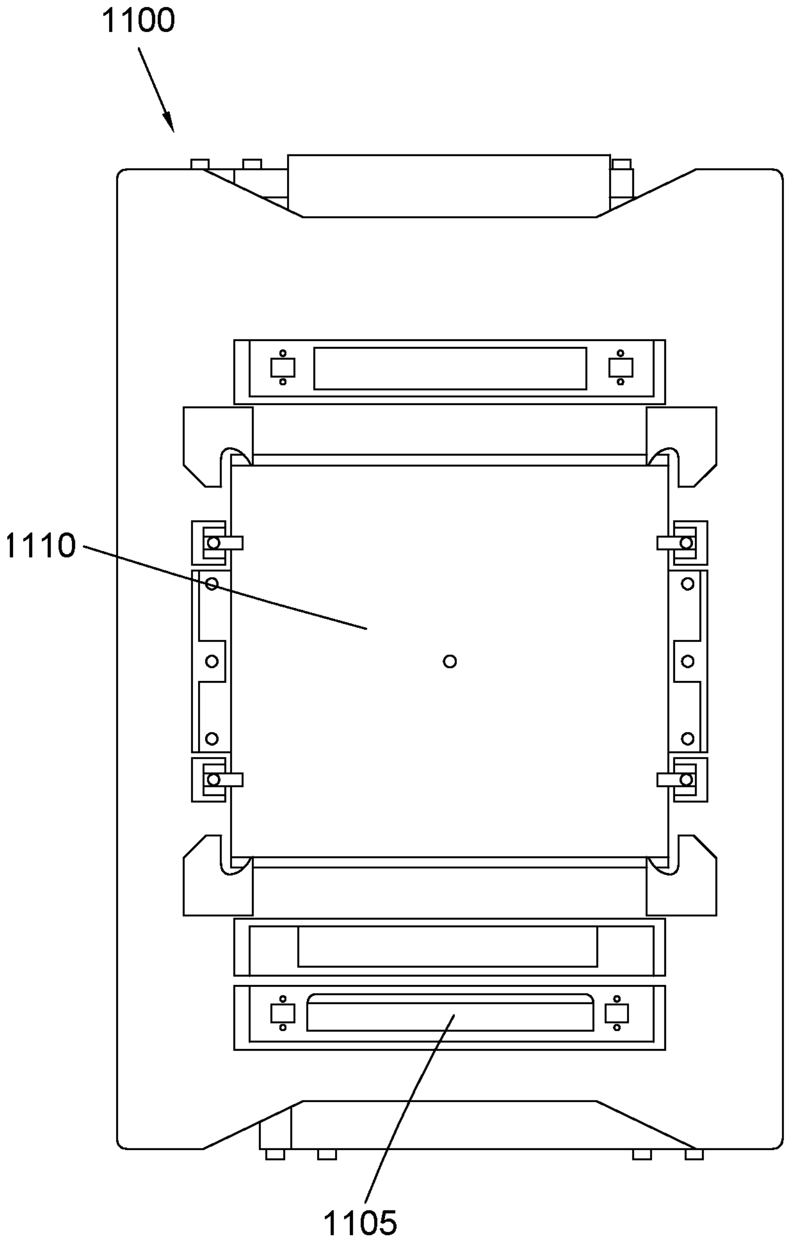
FIG. 11 depicts a reticle stage of a lithographic apparatus comprising a reflective optical element, according to an embodiment of the disclosure.

FIG. 11 depicts plan view of a reticle stage 1100 of a lithographic apparatus LA, according to an embodiment of the disclosure. A first portion 1110 of the reticle stage 1100 is for holding a reticle for patterning a substrate in a lithographic apparatus LA. Also shown is a reflective optical element 1105, which may correspond to any of the disclosed optical elements 305, 505, 605.

In use, a reticle held on the first portion 1110 may be configured to reflect EUV radiation towards a substrate on the substrate table WT. The optical element 1105 may be configured to reflect radiation towards a radiation sensor, e.g. radiation sensor 395 which, in some examples, may also be located at the substrate table WT.

Figure 12:
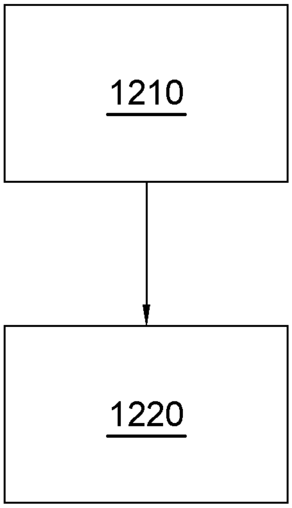
FIG. 12 depicts a method of measuring a degradation of a reflective optical element having a surface for exposure to radiation in a lithographic apparatus.

FIG. 12 depicts a method of measuring a degradation of a reflective optical element having a surface for exposure to radiation in a lithographic apparatus. The method comprises a first step 1210 of providing at least two electrodes at the surface of the reflective optical element. In some embodiments, at least one of the electrodes may be formed on the surface of the optical element, e.g. as depicted in the embodiments of FIGS. 3 and 4. In some embodiments, at least one of the electrodes may extend through the optical element, e.g. as depicted in the embodiments of FIGS. 6, 7 and 8.

The method comprises a second step 1220 of measuring one or more electrical characteristics of the reflective optical element between the at least two electrodes. The one or more electrical characteristics may comprise any of: a capacitance; a resistance; an inductance; and/or a frequency response The method may comprise determining a reflectivity profile of the reflective optical element based, at least in part, on measurements of the one or more electrical characteristics between the electrodes. Furthermore, in some examples the method may comprise identifying a degradation of the reflective optical element by comparing a plurality of measurements of the one or more electrical characteristics taken at different times.

Advantageously, because a determination of electrical characteristics may not impact an optical performance of the optical element, the step of measuring the one or more electrical characteristics of the reflective optical element between the at least two electrodes may performed during a run time of the lithographic apparatus.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

Other aspects of the invention are set out in the following numbered clauses.

1. An optical apparatus for a reticle stage of a lithographic apparatus, the optical apparatus comprising:
   a reflective optical element comprising a surface for exposure to radiation;
   at least two electrodes located at the surface; and
   a measurement system configured to measure one or more electrical characteristics of the reflective optical element between the at least two electrodes.
2. The optical apparatus of any preceding clause, wherein the one or more electrical characteristics comprises at least one of: a capacitance; a resistance; an inductance; and/or a frequency response.
3. The optical apparatus of clause 1 or 2, wherein the reflective optical element comprises a plurality of layers and the at least two electrodes extend through the plurality of layers.
4. The optical apparatus of clause 3, wherein the reflective optical element is configured as a distributed Bragg reflector for reflecting extreme ultraviolet, EUV, radiation.
5. The optical apparatus of clause 3 or 4 comprising at least one electrode formed on each layer of the reflective optical element, and wherein the measurement system is configured to measure one or more electrical characteristics of each layer of the reflective optical element.
6. The optical apparatus of any preceding clause, wherein the measurement system is configured to perform a plurality of measurements taken at different times of the one or more electrical characteristics of the reflective optical element to identify a degradation in reflectivity of the reflective optical element.
7. The optical apparatus of any preceding clause, comprising greater than two electrodes, wherein the measurement system is configured to measure the one or more electrical characteristics of the reflective optical element between pairs of electrodes of the plurality of electrodes.
8. The optical apparatus of clause 7, wherein the greater than two electrodes are distributed around a periphery of the surface.
9. The optical apparatus of clause 7, comprising a plurality of measurement systems, wherein each electrode is connected to a respective measurement system of the plurality of measurement systems.
10. The optical apparatus of any of clauses 7 to 9, wherein the measurement system is configured to determine a reflectivity profile of the reflective optical element based, at least in part, on measurements of the one or more electrical characteristics between the greater than two electrodes.
11. A lithographic apparatus comprising the optical apparatus of any preceding clause.
12. The lithographic apparatus of clause 11, comprising the reticle stage for holding a reticle, wherein the reflective optical element is mounted on or embedded in the reticle stage and configured to reflect the radiation towards a radiation sensor.
13. A lithographic system comprising an EUV radiation source and a lithographic apparatus according to clause 11 or 12.
14. The lithographic system of clause 13, comprising a further system communicably coupled to the measurement system, wherein the further system is configured to adjust an intensity and/or a profile of a beam of radiation for exposing a substrate based, at least in part, on the measured one or more electrical characteristics of the reflective optical element.
15. A method of measuring a degradation of a reflective optical element having a surface for exposure to radiation in a lithographic apparatus, the method comprising:
   providing at least two electrodes at the surface of the reflective optical element; and
   measuring one or more electrical characteristics of the reflective optical element between the at least two electrodes.
16. The method of clause 15, wherein:
   greater than two electrodes are provided at the surface of the reflective optical element; and
   a reflectivity profile of the reflective optical element is determined based, at least in part, on measurements of the one or more electrical characteristics between the greater than two electrodes.
17. The method of clause 15 or 16, wherein a degradation of the reflective optical element is identified by comparing a plurality of measurements of the one or more electrical characteristics taken at different times.
18. The method of any of clauses 15 to 17, wherein the step of measuring one or more electrical characteristics of the reflective optical element between the at least two electrodes is performed during a run time of the lithographic apparatus.

The invention claimed is:

1. An optical apparatus for a reticle stage of a lithographic apparatus, the optical apparatus comprising:

a reflective optical element comprising a surface configured to receive radiation;

at least two electrodes located at the surface; and a measurement system configured to measure one or more electrical characteristics of the reflective optical element between the at least two electrodes.

2. The optical apparatus of claim 1, wherein the one or more electrical characteristics comprises at least one of: a capacitance; a resistance; an inductance; and/or a frequency response.

3. The optical apparatus of claim 1, wherein the reflective optical element comprises a plurality of layers and the at least two electrodes extend through the plurality of layers.

4. The optical apparatus of claim 3, wherein the reflective optical element is configured as a distributed Bragg reflector configured to reflect extreme ultraviolet radiation.

5. The optical apparatus of claim 3, comprising at least one electrode disposed on each layer of the reflective optical element, and wherein the measurement system is configured to measure one or more electrical characteristics of each layer of the reflective optical element.

6. The optical apparatus of claim 1, wherein the measurement system is configured to perform a plurality of measurements taken at different times of the one or more electrical characteristics of the reflective optical element to identify a degradation in reflectivity of the reflective optical element.

7. The optical apparatus of claim 1, comprising two or more electrodes located at the surface, wherein the measurement system is configured to measure the one or more electrical characteristics of the reflective optical element between pairs of the two or more electrodes.

8. The optical apparatus of claim 7, wherein the measurement system is configured to determine a reflectivity profile of the reflective optical element based, at least in part, on measurements of the one or more electrical characteristics between the two or more electrodes.

9. A lithographic apparatus comprising the optical apparatus of claim 1.

10. The lithographic apparatus of claim 9, comprising the reticle stage configured to hold a reticle, wherein the reflective optical element is mounted on or embedded in the reticle stage and configured to reflect the radiation towards a radiation sensor.

11. A lithographic system comprising an EUV radiation source and a lithographic apparatus of claim 9.

12. The lithographic system of claim 11, comprising a further system communicably coupled to the measurement system, wherein the further system is configured to adjust an intensity and/or a profile of a beam of radiation for exposing a substrate based, at least in part, on the measured one or more electrical characteristics of the reflective optical element.

13. A method of measuring a degradation of a reflective optical element having a surface configured to receive radiation in a lithographic apparatus, the method comprising:

providing at least two electrodes at the surface of the reflective optical element; and measuring one or more electrical characteristics of the reflective optical element between the at least two electrodes.

14. The method of claim 13, further comprising:

providing two or more electrodes at the surface of the reflective optical element; and a reflectivity profile of the reflective optical element is determined based, at least in part, on measurements of the one or more electrical characteristics between the two or more electrodes.

15. The method of claim 13, wherein a degradation of the reflective optical element is identified by comparing a plurality of measurements of the one or more electrical characteristics taken at different times.

* * * * *